United States Patent
Buermann et al.

(10) Patent No.: US 6,441,607 B1
(45) Date of Patent: Aug. 27, 2002

(54) APPARATUS FOR DOCKING A FLOATING TEST STAGE IN A TERRESTRIAL BASE

(75) Inventors: Dale Buermann, Los Altos; Daniel Tran, San Jose, both of CA (US)

(73) Assignee: n&k Technology, Inc., Santa Clara, CA (US)

( * ) Notice: Subject to any disclaimer, the term of this patent is extended or adjusted under 35 U.S.C. 154(b) by 0 days.

(21) Appl. No.: 09/728,809

(22) Filed: Dec. 1, 2000

(51) Int. Cl.[7] .................................................. G01R 3/02
(52) U.S. Cl. ..................................................... 324/158.1
(58) Field of Search ............................... 324/758, 765, 324/158.1

(56) References Cited

U.S. PATENT DOCUMENTS

| | | | | |
|---|---|---|---|---|
| 4,610,020 A | * | 9/1986 | La Fiandra | 250/491.1 |
| 4,755,746 A | * | 7/1988 | Mallory et al. | 324/158.1 |
| 4,786,867 A | * | 11/1988 | Yamatsu | 324/158.1 |
| 4,929,893 A | * | 5/1990 | Sato et al. | 324/158.1 |
| 5,046,707 A | * | 9/1991 | Allen | 269/309 |
| 5,148,103 A | * | 9/1992 | Pasiecznik | 324/158.1 |
| 5,539,676 A | * | 7/1996 | Yamaguchi | 364/559 |
| 5,642,056 A | * | 6/1997 | Nakajima et al. | 324/758 |
| 5,656,942 A | | 8/1997 | Watts et al. | 324/754 |
| 5,982,182 A | * | 11/1999 | Chiu et al. | 324/754 |
| 6,150,832 A | * | 11/2000 | Mazur et al. | 324/765 |
| 6,166,552 A | * | 12/2000 | O'Connell | 324/754 |

* cited by examiner

Primary Examiner—Michael J. Sherry
Assistant Examiner—Jimmy Nguyen
(74) Attorney, Agent, or Firm—Lumen Intellectual Property Services, Inc.

(57) ABSTRACT

A system for docking a floating test stage with integrated testing equipment to a predetermined position relative to a terrestrial base is described. The system includes a cylinder for docking the test stage to the predetermined position and a vibration isolation system for isolating the test stage when it is floating over the base. The system also includes a handling unit indexed to the predetermined position for loading and unloading samples on the test stage.

5 Claims, 5 Drawing Sheets

APPARATUS FOR DOCKING A FLOATING TEST STAGE IN A TERRESTRIAL BASE

FIELD OF THE INVENTION

This invention relates generally to the docking of a floating test stage. More particularly, it relates to an apparatus for docking the test stage at a well-defined relative position between the test stage and a terrestrial base.

BACKGROUND ART

In the field of precision testing it is very important to isolate the sample from any external influences which interfere with the test and affect its results. The effects of external atmospheric influences are typically removed by placing the sample in an appropriate test chamber, e.g., a vacuum chamber. In these cases, the testing mechanism can be mounted in the chamber or external to it, depending on the types of measurements being performed.

In many cases, however, and especially in high precision measurements, the most detrimental external influences include mechanical disturbances such as jarring movements and vibrations. In the prior art, vibration isolation is commonly achieved by mounting the sample handling unit and testing apparatus on vibration isolated stages. In some fields, e.g., in optics where optical components are very sensitive to proper alignment and relative positioning, these components are mounted on optical benches with a hydraulic vibration isolation system. Such systems typically include one or more hydraulic cylinders or pneumatic cylinders. These types of benches are isolated from the base on which they are positioned, e.g., the floor. However, in the prior art system the sample can not be positioned precisely on the test stage, which is required for some precision measurements, since a loading state is not engaged with an appropriate vibration isolating mechanism.

There is a need, therefore, for an optical testing system with test stage docked to a loading stage at which the sample can be positioned precisely on the test stage.

SUMMARY

Disadvantages associated with the prior art are overcome by a system for docking a floating test stage with integrated testing equipment at a predetermined position or docking position relative to a terrestrial base.

According to an exemplary embodiment, the system has a lift mechanism connected to the test stage and the base for docking the test stage to the docking position relative to the base. The system also includes a vibration isolation mechanism connected to the test stage for isolating the test stage from vibrations experienced by the base when floating over the base. The system also includes a first engaging mechanism connected to the vibration isolation mechanism for engaging with a second engaging mechanism positioned in the base. The first engaging means consists of a set of recesses, which can be flats, grooves, sockets and their combinations. The second engaging mechanism includes a set of projections, which may be balls, dimensioned to enter into the recesses in the first engaging mechanism. The second engaging mechanism is designed to engage and guide the test stage to a testing place. The first engaging mechanism may include three recesses oriented at substantially 120° to each other, and the second engaging mechanism includes three corresponding projections.

Alternatively, the first engaging mechanism includes four recesses oriented at four corners of a rectangular, and the second engaging means includes four corresponding projections.

Alternatively, the second engaging mechanism can include a set of recesses, and the first engaging mechanism can include a set of projections.

The vibration isolation mechanism includes a set of shock absorbers, which can be hydraulic or pneumatic cylinders terminated with mechanical stages in which the recesses are machined. In addition, the shock absorbers can be either passive or active shock absorbers, and can be either in compression or tension. The lift mechanism also includes hydraulic or pneumatic cylinder and can simultaneously act as a shock absorber. The lift mechanism is mechanically decoupled from the base when the test stage is floating to achieve vibration isolation.

The system also includes a sample handling unit indexed to the docking position. The sample handling unit is used for loading and unloading samples, which are tested, on the test stage when the test stage is in docking position. The docking position is actually in a docking plane in three-dimensional space, and so the sample handling unit is indexed to that docking plane.

The system of the invention can be used in docking test stages used for optical testing of samples such as semiconductor wafers. In this case the testing equipment can include an optical source, e.g., a laser or some other light source. The equipment can also include an optical measurement unit, e.g., a photodetector or spectrometer for measuring the light reflected by the wafer. It is further advantageous that the test stage has a planar support mechanism for supporting planar samples. The test stage as well as the base can be enclosed in a test chamber, e.g., a vacuum chamber if desired.

Further details of the invention are set forth in the following detailed description with reference to the attached drawing figures.

DETAILED DESCRIPTION

Figure 1:
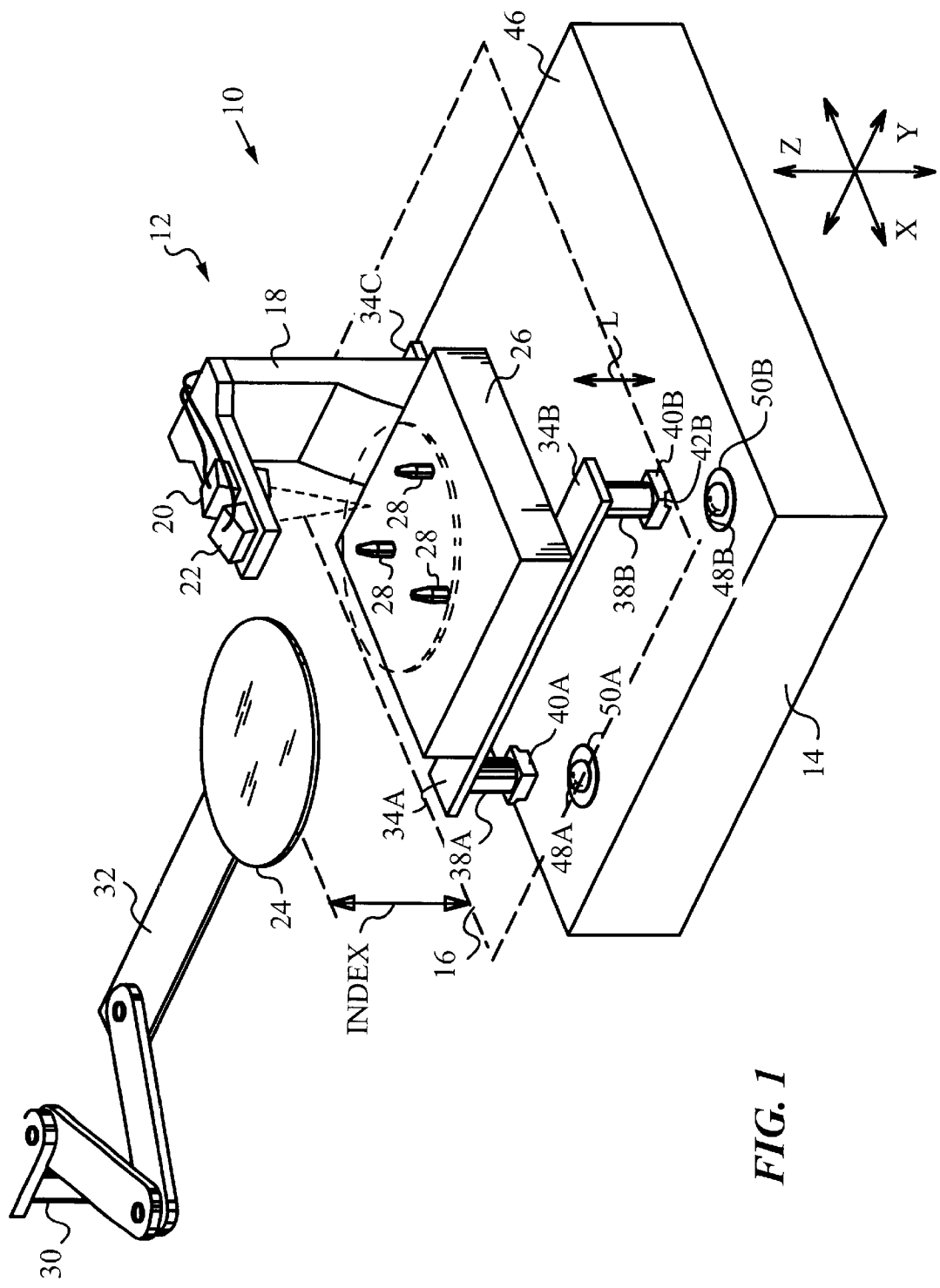
FIGS. 1 is a top isometric view illustrating a system for docking a test stage according to an exemplary embodiment of the present invention.

FIG. 1 lillustrates a top isometric view of a system 10 for docking a floating test stage 12 to a predetermined position or docking position. Specifically, the docking position is a relative position between test stage 12 and a terrestrial base 14 defined by a docking plane 16 in three-dimensional space described for convenience by the three Cartesian axes X, Y, Z.

As show in FIG. 1, terrestrial base 14 is typically a support base or part of a frame of a larger device on which the tests are being performed. In fact, base 14 is typically positioned on a floor or is in mechanical contact with a floor, a support or a ground, which experiences uncontrolled movements. For the purpose of this application any movements coupling to or affect base 14 are referred to as mechanical vibrations. Such vibrations can include earthquakes, regular and irregular vibrations or movements of the floor or any other intervening structures between the earth, the floor and base 14 or just vibrations of base 14 itself.

Test stage 12 is of the type requiring isolation from mechanical vibrations. In this embodiment test stage 12 is an optical test stage. Test stage 12 has integrated testing equipment 18 consisting of a light source 20, such as a laser source and the like, for performing the intended optical measurements, and an optical measurement unit 22. Measurement unit 22 can be a photodetector, a spectrometer or any other suitable device.

Test stage 12 is designed for optically examining planar samples 24, such as a semiconductor wafer, and measurement unit 22 is set up to measure light reflected by sample 24. Test stage 12 has a test block 26 with a planar support mechanism represented by three support pins 28 for supporting sample 24. The test position of sample 24 on pins 28 is indicated in a dashed line.

As shown in FIG. 1, test stage 12 rests on a structure including three extensions 34A, 34B, 34C. Extensions 34A, 34B, 34C reach beyond test block 26 in order to provide better mechanical stability during the docking process and ensure exact positioning of test stage 12 in docking plane 16 as described below.

A vibration isolation mechanism consists of shock absorbers 38A, 38B, 38C attached to extensions 34A, 34B, 34C. Shock absorbers 38A, 38B, 38C are terminated with plates 40A, 40B, 40C better seen in the bottom view of FIG. 2. A first engaging mechanism includes a set of recesses 42A, 42B, 42C machined in plates 40A, 40B, 40C, which are designed to interlock or engage with a second engaging mechanism 44 in base 14. Recesses 42A, 42B, 42C can be grooves, flats, sockets, or their combinations.

As shown in FIG. 1, second engaging mechanism includes three projections 48A, 48B, 48C mounted at sites 50A, 50B, 50C (projection 48C and site 50C not visible in this drawing) on a top side 46 of base 14. Projections 48A, 48B, 48C are in the form of fingers shaped to enter and engage in grooves 42A, 42B, and 42C of first engaging mechanism 36. Projections 48A, 48B, 48C are also designed to guide test stage 12 holding sample 24 as it is dropping from the docking plane to a testing plane (which is not shown in FIG. 1), at which the measurements on the sample 24 are performed.

Figure 3:
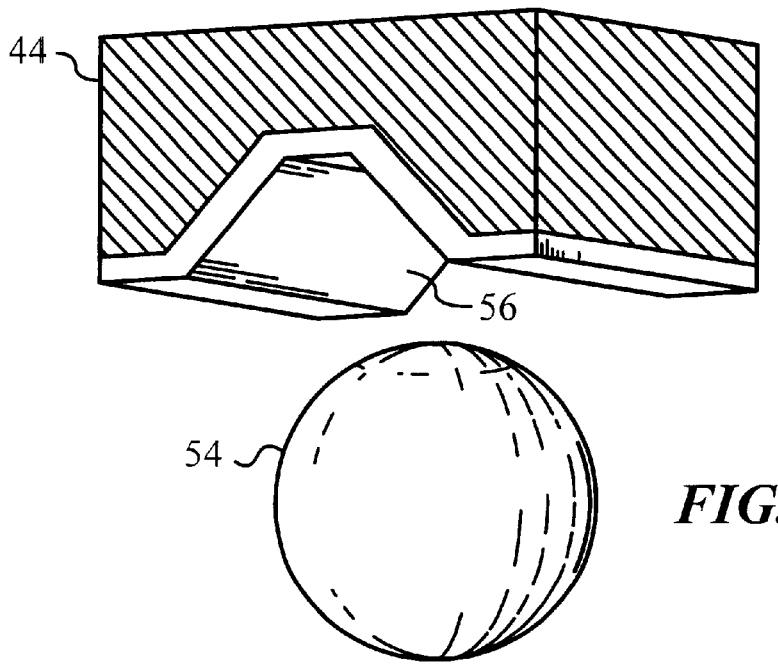
FIG. 3 is a three dimensional view showing a portion of the system in FIG. 1.
Figure 4:
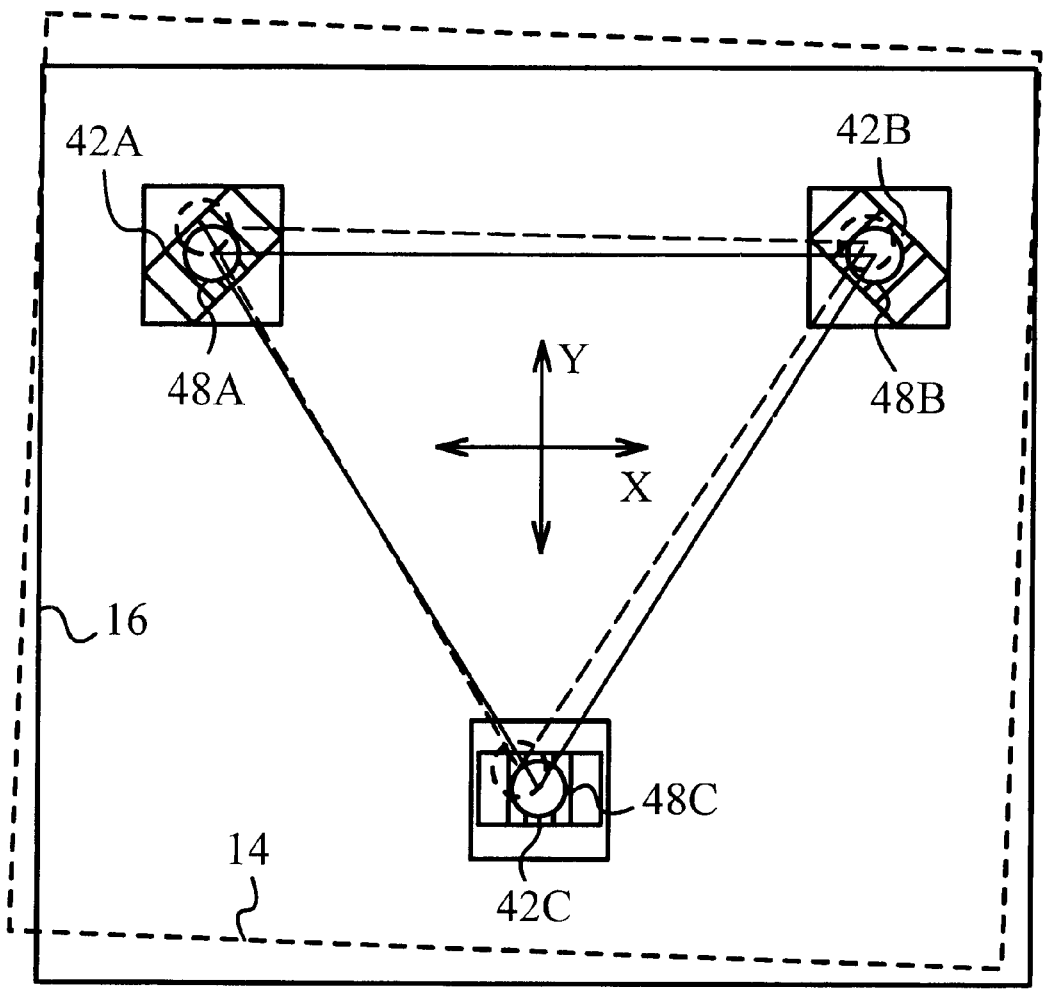
FIG. 4 is a plan schematic view illustrating a relative position between a test stage and a base defined by the engagement mechanisms during docking.

Preferably, projections 48A, 48B, 48C are balls and recesses 42A, 42B, 42C are flat bottom grooves. FIG. 3 shows a ball 54 which can be used in second engaging mechanism 44 to engage with a corresponding groove 56 of first engaging mechanism 36. It should be noted that not all projections 48A, 48B, 48C need to be balls and not all recesses have to be in the form of groove 56 (e.g., the recesses can be flats or sockets). Grooves 42A, 42B, 42C are oriented at substantially 120 degrees to each other, as shown in FIG. 4. Vibrations experienced by base 14 produce an offset or misalignment between grooves 42A, 42B, 42C and balls 48A, 48B, 48C as indicated in dashed lines. However, once balls 48A, 48B, 48C are engaging in grooves 42A, 42B, 42C, test stage 12 will settle into a testing plane at which the measurements are performed. A person skilled in the art will recognize that the first engaging mechanism alternatively contains the balls, and the second engaging mechanism can include the grooves.

Figure 2:
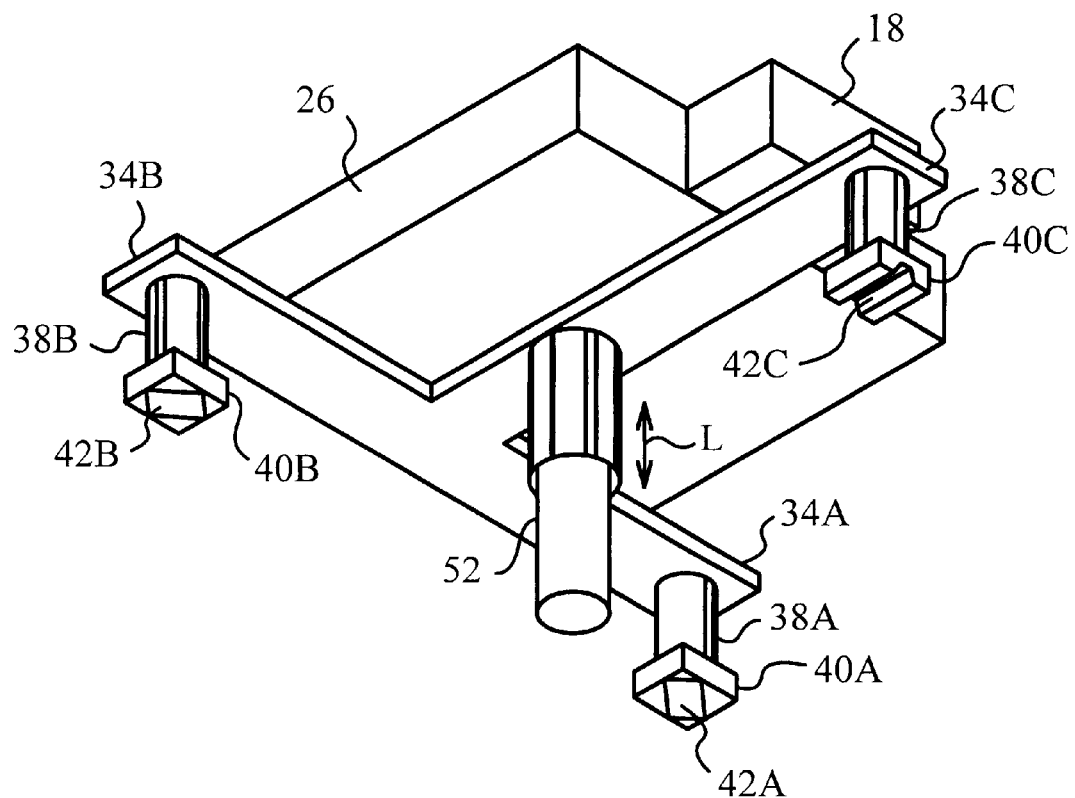
FIG. 2 is a bottom isometric view of the system in FIG. 1.

Referring to FIG. 2, system 10 includes a lift mechanism 52 coupled to the test stage 12 and the base 14 for docking test stage 12 to the docking plane 16. The axis along which stage 12 is lifted and lowered over base 14 is indicated by arrow L. The lift mechanism 52 can be a hydraulic cylinder or pneumatic cylinder. Optionally, cylinder 52 can simultaneously act as a shock absorber for isolating test stage 12 from mechanical vibrations of base 14 while stage 12 is docked or floating over base 14. Lift mechanism 52 can be mechanically decoupled from base 14 when test stage 12 is floating over base 14 to achieve vibration isolation.

Referring back to FIG. 1, system 10 has a sample handling unit 30 with an arm 32 for loading and unloading wafers 24 on support pins 28 of test block 26. Handling unit 30 is indexed to docking plane 16, as indicated in FIG. 1. In other words, arm 32 of unit 30 is set to load and unload wafers 24 at the indexed height when test stage 12 is settled in docking plane 16.

During operation test stage 12 is initially in a testing plane at which the recesses 42A, 42B, 42C of the first engaging mechanism contact with the projections 48A, 48B, 48C of the second engaging mechanism. Test stage 12 is then docked by the cylinder 52 to docking plane 16. At this stage, the set of recesses 42A, 42B, 42C are not in contact with the set of projections 48A, 48B, 48C. At this time, the handling unit 30 loads wafer 24 to be tested on three support pins 28 on the block 26. Next, test stage 12 is dropped to the testing plane while the recesses 42A, 42B, 42C are engaging with the projections 48A, 48B, and 48C to ensure that test stage 12 settles into the testing plane. Now, testing equipment 18 performs the necessary tests and/or measurements on wafer 24 while the system 10 is isolated from mechanical vibrations by the shock absorbers 38A, 38B, 38C. After the measurements are completed, cylinder 52 docks test stage 12 to docking plane 16. At this stage, tested wafer 24 is unloaded by the handling unit 30 and the entire operation repeated.

Figure 5:
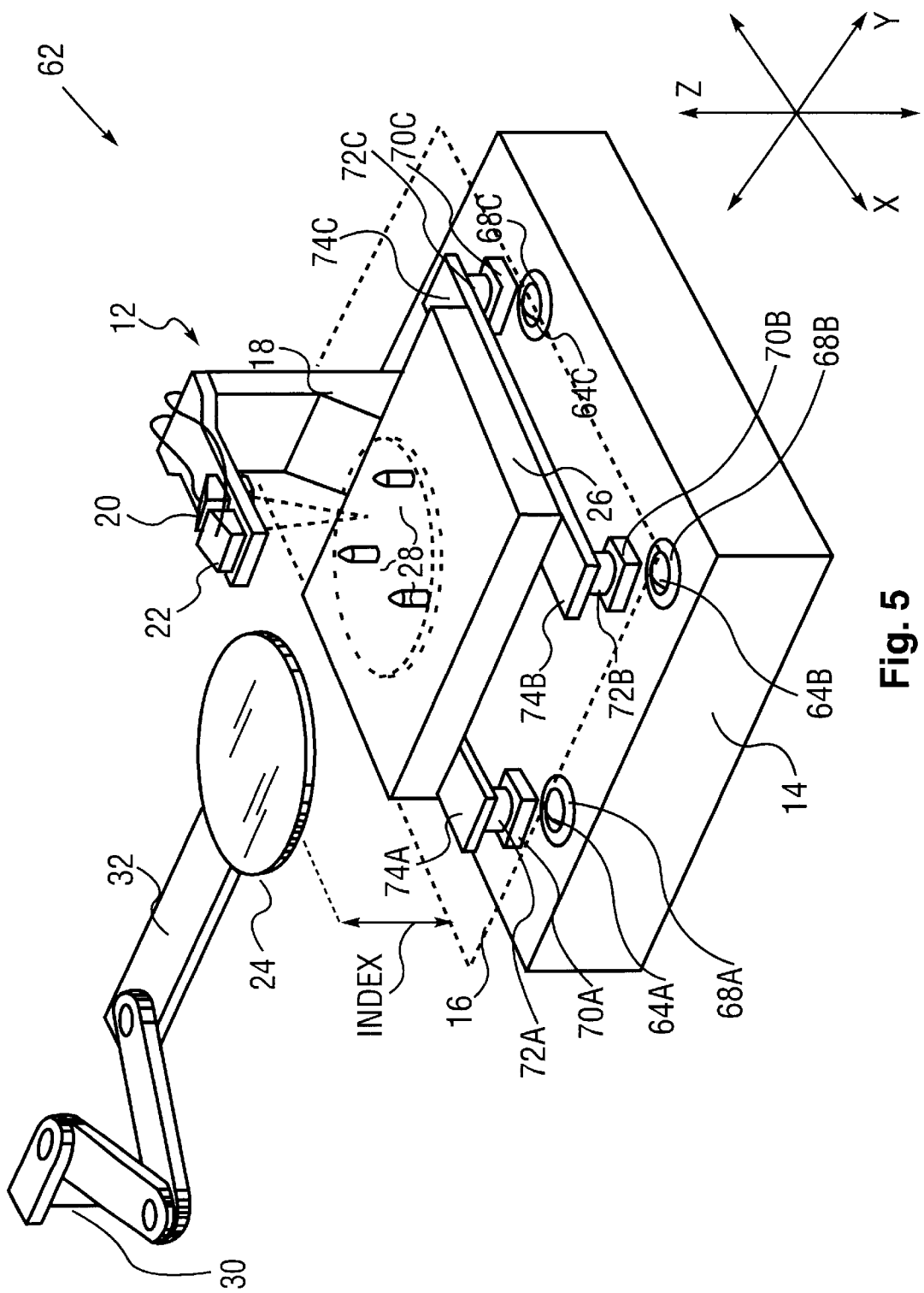
FIG. 5 is a top isometric view illustrating an alternative system of the present invention.
Figure 6:
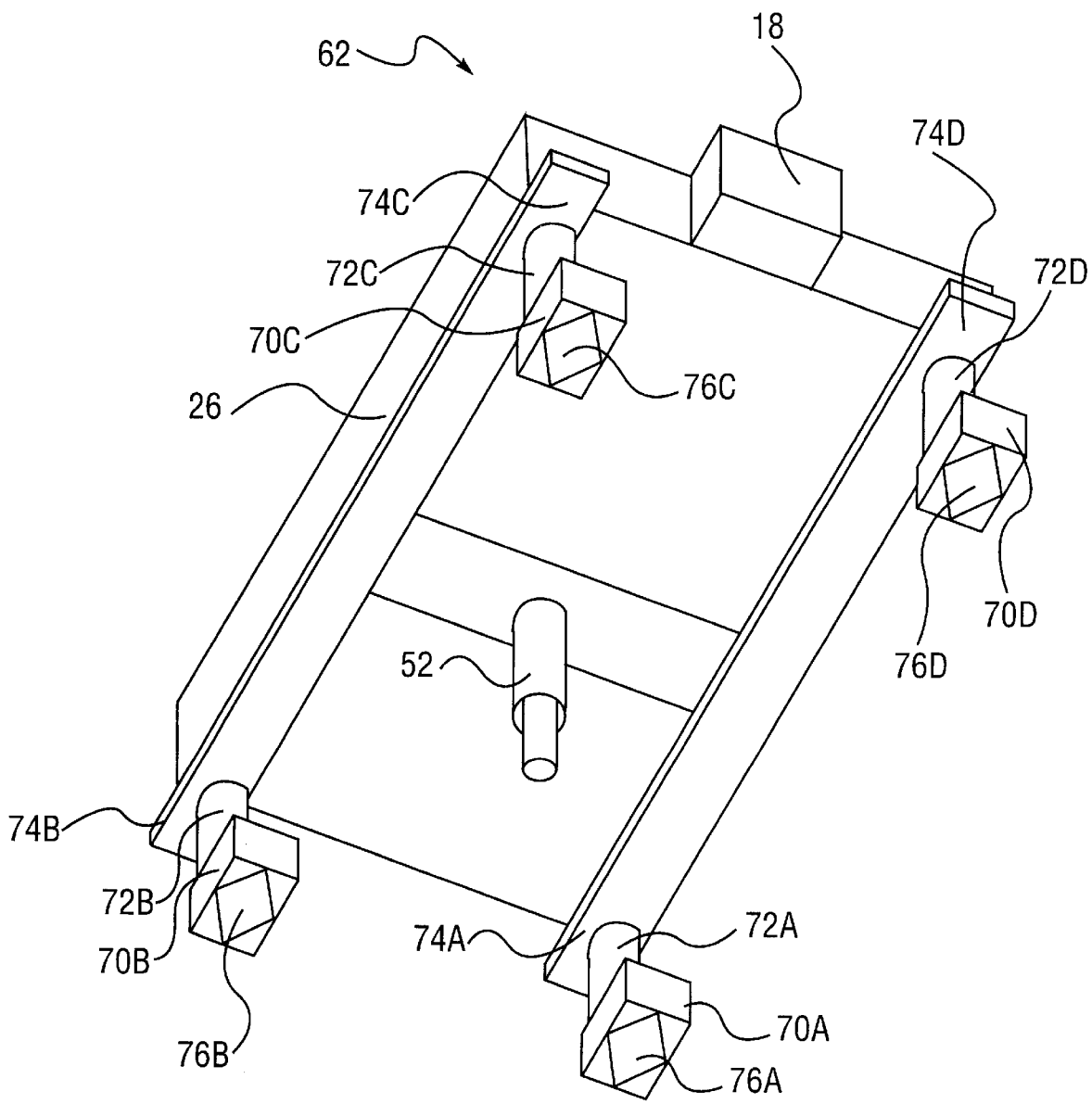
FIG. 6 is a bottom isometric view of the system in FIG. 5.

FIGS. 5 and 6 shows top and bottom isometric views of a system 62 which is similar with system 10 in FIG. 1 except that the engaging mechanisms include four engaging elements oriented at four corners of a rectangular, which provides better mechanical stability for the test stage 12 during the docking. As shown in FIGS. 5 and 6, first engaging mechanism includes four recesses 76A, 76B, 76C, 76D machined in mechanical stages 70A, 70B, 70C, 70D terminating at the bottom of shock absorbers 72A, 72B, 72C, 72D. Second engaging mechanism 64 includes four corresponding projections 64A, 64B, 64C, 64D machined on the mechanical plates 68A, 68B, 68C, 68D positioned on the base 14. Test stage 12 rests on a structure including four extensions 74A, 74B, 74C, 74D. Extensions 74A, 74B, 74C, 74D reach beyond test block 26 in order to provide better mechanical stability during.

However, a person skilled in the art will be able to develop other engaging mechanisms with more than four mutually engaging elements.

Furthermore, it should be noted that the system of invention including all its components can be enclosed in a test chamber, e.g., a vacuum chamber if desired. It can also be integrated with other testing equipment.

It will be clear to one skilled in the art that the above embodiment may be altered in many ways without departing from the scope of the invention. Accordingly, the scope of the invention should be determined by the following claims and their legal equivalents.

What is claimed is:

1. A system for docking a floating test stage with integrated testing equipment at a predetermined position relative to a terrestrial base, said system comprising:
   a) a lift mechanism coupled to said test stage and said terrestrial base for docking said test stage at the predetermined position;
   b) a vibration isolation mechanism connected to said test stage for isolating said test stage when said test stage is floating over said terrestrial base from vibrations experienced by said terrestrial base;
   c) a first engaging mechanism connected to said vibration isolation mechanism and wherein said vibration isolation mechanism comprises a set of shock absorbers terminated with mechanical stages in which said first engaging means is machined;
   d) a second engaging mechanism in said terrestrial base for engaging with said first engaging mechanism; and
   e) a sample handling unit indexed to said predetermined relative position for loading samples on said test stage.

2. The system of claim 1, wherein said shock absorbers are passive shock absorbers.

3. The system of claim 1, wherein said shock absorbers are active shock absorbers.

4. The system of claim 1, wherein said shock absorbers are in tension.

5. The system of claim 1, wherein said shock absorbers are in compression.

* * * * *